(12) United States Patent  
Miller

(10) Patent No.: US 6,555,934 B2  
(45) Date of Patent: Apr. 29, 2003

(54) METHOD AND APPARATUS FOR CONTROL OF LARGE-AREA GROUND PLANE POTENTIALS

(75) Inventor: Christopher R. Miller, Delafield, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 45 days.

(21) Appl. No.: 09/739,156

(22) Filed: Dec. 18, 2000

(65) Prior Publication Data

US 2002/0074864 A1 Jun. 20, 2002

(51) Int. Cl.$^7$ .................................................. H02J 1/00
(52) U.S. Cl. ........................................ 307/103; 361/42
(58) Field of Search ............................. 307/103, 105; 361/42, 58; 340/649

(56) References Cited

U.S. PATENT DOCUMENTS

| | | | | |
|---|---|---|---|---|
| 2,651,773 A | * | 9/1953 | Loudon | 178/69 R |
| 4,398,188 A | * | 8/1983 | Feigal et al. | 327/50 |
| 4,503,480 A | * | 3/1985 | Pickard et al. | 361/152 |
| 4,763,007 A | * | 8/1988 | Takahashi | 358/471 |
| 4,969,062 A | * | 11/1990 | Barylak et al. | 361/42 |
| 5,321,318 A | * | 6/1994 | Montreuil | 307/326 |
| 5,420,452 A | * | 5/1995 | Tran et al. | 257/428 |
| 5,512,848 A | * | 4/1996 | Yaklin | 327/307 |
| 5,818,672 A | * | 10/1998 | Hilbe | 361/111 |
| 5,825,170 A | * | 10/1998 | Montreuil | 119/14.03 |
| 5,869,909 A | * | 2/1999 | Silverberg et al. | 307/105 |

OTHER PUBLICATIONS

"Precision High–Speed Difet® Operational Amplifiers", OPA627/637, Burr–Brown Technical Data Sheet, Mar., 1998.

"Ultralow Distortion, Ultralow Noise Op Amp", AD797, Rev. C, Analog Devices Technical Data Sheet, Jun. 1992.

* cited by examiner

Primary Examiner—Brian Sircus
Assistant Examiner—Sharon A. Polk
(74) Attorney, Agent, or Firm—McAndrews, Held & Malloy, Ltd.; Peter J. Vogel; Michael A. Dellapenna

(57) ABSTRACT

A method for controlling ground plane voltages by locally, at one or more discrete points on the working ground reference, sensing a voltage difference between a working ground reference and an isolated ground reference, generating a voltage compensation signal based on the voltage difference, and driving the working ground reference with the voltage compensation signal to reduce the voltage difference.

17 Claims, 2 Drawing Sheets

METHOD AND APPARATUS FOR CONTROL OF LARGE-AREA GROUND PLANE POTENTIALS

BACKGROUND OF THE INVENTION

The present invention relates to control of ground plane voltages in electronic systems. In particular, the present invention relates to control of ground plane voltages over extensive ground plane areas through the use of voltage sensors and drivers.

In electronic systems, a ground establishes a reference that is the basis for determining the magnitude of voltages present at other points in the circuitry. However, typically there is not a single ground point. Rather, the electronic system may be built, for example, using a multi-layer printed circuit board in which one or more layers is a solid copper ground layer. Individual electronic components are distributed on the top and bottom (outermost layers) of the circuit board and connected to the ground plane through via(s) that terminate on the ground plane(s). During operation of the electronic system, currents flow through the electronic components and into or out of the ground plane.

The solid copper ground plane (more generally, any distribution of ground traces) has a small but finite resistance between any two points. As a result, ground plane currents will create potential differences in the ground plane itself according to the net vector ground plane current. Therefore, a voltage measurement elsewhere in the electronic system depends on the particular point in the ground plane used as the reference. The difference in measured voltage can be quite significant between two distinct points on the ground plane, often on the order of several millivolts.

While certain systems may be relatively immune to a change in voltage of a few millivolts, other, more sensitive systems can be dramatically effected. For example, the extreme sensitivity of Charge Coupled Devices and solid state X-ray detectors renders them very susceptible to variation in ground plane potential. Very small spatial differences in ground plane potential can cause image artifacts during the readout of the detector. Generally, the variation in ground plane potential includes a DC and an AC component.

The DC component of the variation in ground plane potential may sometimes be zeroed out by subtracting a reference (or "dark") image from a subsequently captured image. This reference (dark) image is made at a time when there is no x-ray illumination, and therefore contains only static (DC) offset information. Naturally, additional processing complexity and processing time are required to perform dark image subtraction. Furthermore, the AC component of the variation in ground plane potential is not corrected by dark image subtraction. As a result, even complex electronic systems that perform dark image subtraction remain susceptible to image artifacts which are caused by changing (AC) currents and voltages. As examples, the image artifacts in x-ray images can result in reduced image quality, reduced diagnostic usefulness, and inconsistent imaging of the same target.

A need has long existed for a method and apparatus that addresses the problems noted above and others previously experienced.

BRIEF SUMMARY OF THE INVENTION

A preferred embodiment of the present invention provides a ground voltage control system. The ground plane voltage control system includes a working ground reference, and an isolated ground reference connected to the working ground reference. The isolated ground reference is connected such that current flow in the isolated ground reference is reduced below a predetermined threshold in order to keep the voltage gradients at an acceptably low level. The ground plane voltage control system also includes a voltage controller. The voltage controller includes a first sense input connected to the isolated ground reference, a second sense input connected to the working ground reference, and a controller output connected to the working ground reference. The controller output carries a voltage compensation signal to drive a current into or out of the working ground reference to offset a voltage difference sensed between the isolated ground reference and the working ground reference.

Another preferred embodiment of the present invention provides a method for controlling ground plane voltage. The method includes sensing a voltage difference between a working ground reference and an isolated ground reference, generating a voltage compensation signal based on the voltage difference, and driving the working ground reference with the voltage compensation current signal in order to reduce the voltage difference between the isolated ground reference and the working ground reference at the point where the voltage of the working ground reference was sampled.

DETAILED DESCRIPTION OF THE INVENTION

Figure 1:
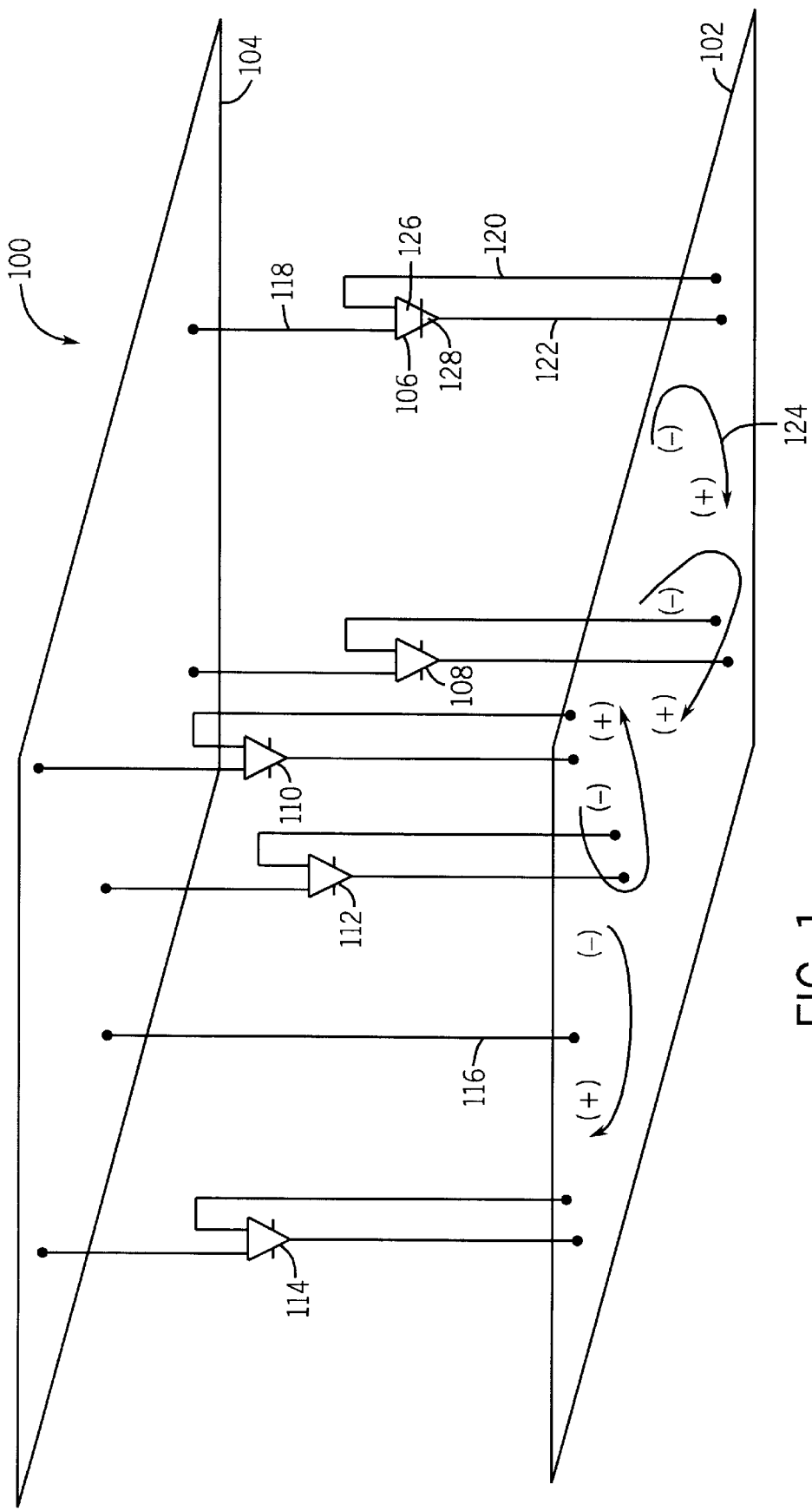
FIG. 1 illustrates a ground voltage control system.

Turning now to FIG. 1, that figure illustrates a ground plane voltage control system 100 including a working ground reference 102, an isolated ground reference 104, and several voltage controllers 106, 108, 110, 112, 114 distributed to monitor different local areas of the working ground reference 102. A single connection 116 may be made between the working ground reference 102 and the isolated ground reference 104 so that current does not circulate between the working ground reference 102 and the isolated ground reference 104.

Each voltage controller, for example the voltage controller 106, includes a first sense input 118 connected to the isolated ground reference 104, a second sense input 120 connected to the working ground reference 102, and a controller output 122 connected to the working ground reference 102. The controller output 122 carries a voltage compensation signal to drive a current into or out of the working ground reference 102. In particular, the voltage compensation signal drives the working ground reference 102 locally to offset a voltage difference sensed by the voltage controller 106 between the isolated ground reference 104 and the working ground reference 102 at the point where the second sense input 120 is connected. Such voltage differences may be caused by locally circulating currents, for example, the local current 124.

As examples, the working ground reference 102 may be the general purpose ground plane of a solid state X-ray detector (e.g., a large area 41 cm by 41 cm square detector) or a printed circuit board. The isolated ground reference 104 may be a separate metal layer provided specifically for use as a ground reference. The voltage controllers 106–114 may be operational amplifiers, preferably with low DC input offset, low input noise, substantial gain-bandwidth product, and the output current capacity requisite to counteract currents locally circulating in the working ground reference 102. The implementation of the voltage controllers 106–114 therefore varies between systems. In a solid state X-ray detector, as an example, a high band-width, low-noise amplifier such as the Analog Devices AD797 or Burr-Brown OPA 627, followed by a discrete high current output stage may be used as the voltage controller. If DC voltage differences as well as AC voltage differences are important, amplifiers with very low DC input offset may be used. Such a configuration is schematically indicated in FIG. 1 with the differential voltage sensor 126 and voltage/current driver 128 electronics in the voltage controller 106.

In general, the voltage controllers 106–114 may be distributed evenly about the working ground reference 102, in a predetermined pattern, or in an uneven pattern, as required to control the working ground reference 102 voltage differences. The number of voltage controllers 106–114 is chosen in accordance with the severity of the local circulating currents and their effects. Thus, the number and location of voltage controllers 106–114 is selected to reduce variations in the ground voltage around the working ground reference 102 to below a predetermined threshold (e.g., 10 microvolts).

In a solid state X-ray detector, because of the detector's ability to compensate for static (DC) differences, the AC differences are those of primary importance. As such, local time-variant (AC) voltage differences as small as several tens of microvolts in the working ground reference 102 may cause unacceptable image artifacts. The voltage differences cause erroneous charge changes at the input of analog readout electronics for the X-ray detector pixels distributed over the working ground reference 102. The sensitivity of the readout electronics is such that a single least significant bit may be represented by only 275 electrons. For example, assuming 20 pf capacitance between an analog input line and a readout electrode, a voltage change of 10 microvolts will shift the output by almost 5 least significant bit counts. Spatially distributed flicker and other artifacts result.

Under operation of the present invention, however, the voltage controllers 106–114 minimize these voltage differences. Spatially distributed flicker and other associated readout defects are thereby minimized.

In some fluoroscopic applications, the read out rate of the X-ray detector may meet or exceed 30 frames per second and the bandwidth of the voltage controllers 106–114 is preferably two to three orders of magnitude higher. For example, a bandwidth of 100 KHz may be generally suitable, but the actual bandwidth chosen may also depend on the magnitude of the voltage differences expected between the isolated ground plane 104 and the working ground reference 102.

Figure 2:
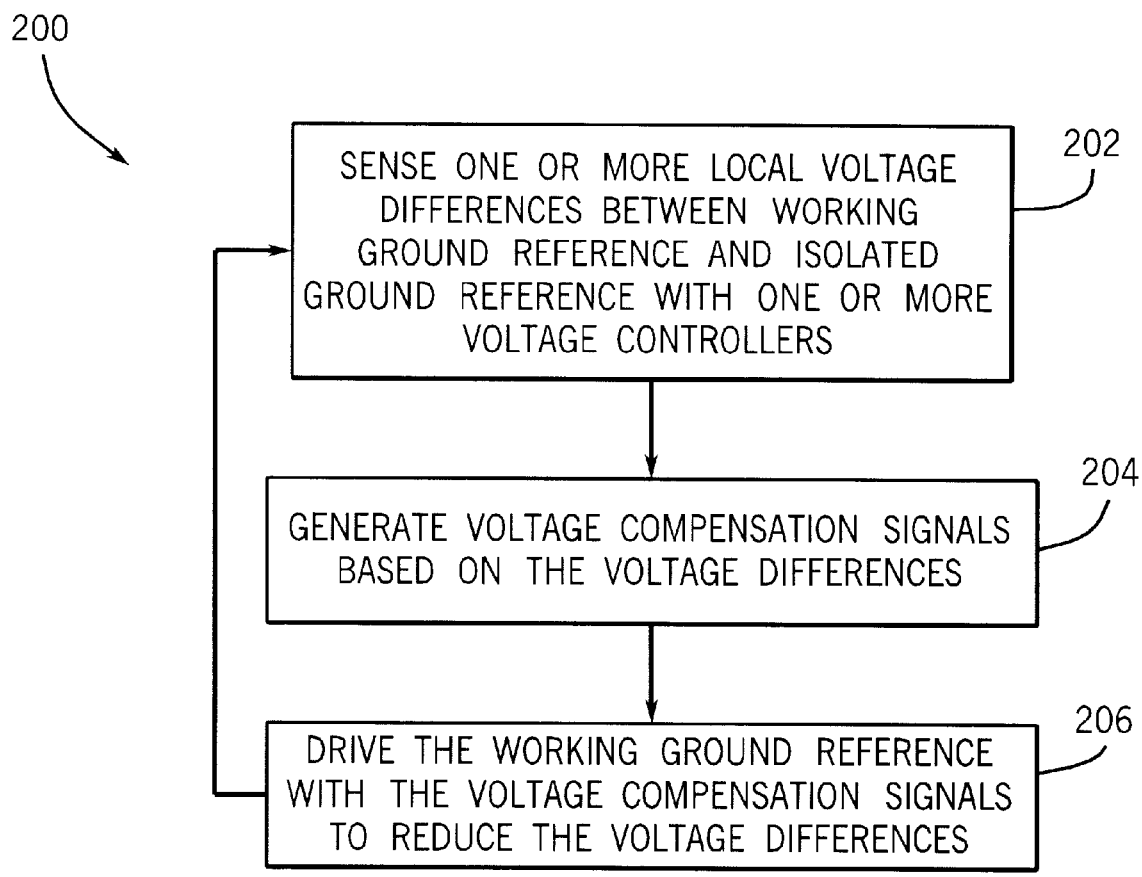
FIG. 2 shows a method for controlling ground voltage.

Turning next to FIG. 2, that figure illustrates a flow diagram 200 of a method for controlling ground voltage. At step 202, the voltage controllers 106–114 determine one or more local voltage differences between the working ground reference 102 and the isolated ground reference 104. Subsequently, at step 202, the voltage controllers generate voltage compensation signals which are driven into the working ground reference 102 to reduce, or preferably eliminate, the local voltage differences (step 204). As noted above, the voltage controllers 106–114 are preferably distributed to control the local voltage differentials in the working ground reference 102 at numerous locations to minimize voltage differences around the working ground reference 102.

While the invention has been described with reference to a preferred embodiment, those skilled in the art will understand that various changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. A ground voltage control system comprising:

a working ground reference;

an isolated ground reference connected to the working ground reference such that current flow in the isolated ground reference is reduced below a predetermined threshold;

a first voltage controller comprising a first sense input connected to the isolated ground reference, a second sense input connected to the working ground reference, and a first controller output connected to the working ground reference, the first controller output carrying a voltage compensation signal to drive current into and out of the working ground reference to offset a voltage difference sensed between the isolated ground reference and the working ground reference; and a second voltage controller comprising a third sense input connected to the isolated ground reference, a fourth sense input connected to the working ground reference, and a second controller output connected to the working ground reference, the second controller output carrying an additional voltage compensation signal to drive the working ground reference to offset an additional voltage difference sensed between the isolated ground reference and the working ground reference.

2. The ground voltage control system of claim 1, wherein the first voltage controller further comprises:

a differential voltage sensor connected to the first and second sense inputs; and a voltage driver connected to the differential voltage sensor and the first controller output.

3. The ground voltage control system of claim 1, wherein the isolated ground reference is connected to the working ground reference through a single connection to substantially eliminate current flow between the isolated ground reference and the working ground reference.

4. The ground voltage control system of claim 1, wherein an operational amplifier comprises the first voltage controller.

5. The ground voltage control system of claim 1, wherein the working ground reference provides the ground for a plurality of electrical system components.

6. The ground voltage control system of claim 1, further comprising a plurality of additional voltage controllers each comprising a sense input connected to the isolated ground reference, a sense input connected to the working ground reference, and a controller output connected to the working ground reference, each controller output carrying a voltage compensation signal to drive current into or out of the working ground reference to offset a voltage difference sensed between the isolated ground reference and the working ground reference.

7. The ground voltage control system of claim 6, wherein the working ground reference is a solid state X-ray detector working ground reference.

8. The ground voltage control system of claim 7, wherein the plurality of additional voltage controllers are distributed to monitor different local areas of the working ground reference.

9. The ground voltage control system of claim 8, wherein at least one of the additional voltage controllers comprises a differential voltage sensor and a voltage driver.

10. The ground voltage control system of claim 6, wherein the plurality of additional voltage controllers are distributed in one of an evenly distributed pattern, a predetermined pattern, and an uneven pattern about the working ground reference.

11. The ground voltage control system of claim 6, wherein the plurality of additional voltage controllers are distributed based on locations of one or more local circulating currents.

12. The ground voltage control system of claim 6, wherein a total number of the plurality of additional voltage controllers is selected based on reducing said voltage differences to below a predetermined threshold.

13. The ground voltage control system of claim 1, wherein the working ground reference is a solid state X-ray detector working ground reference.

14. A method for controlling ground plane voltage comprising:

sensing at least one voltage difference between a working ground reference and an isolated ground reference with a plurality of distributed voltage controllers;

generating at least one voltage compensation signal based on the voltage difference; and driving current into or out of the working ground reference with the at least one voltage compensation signal to reduce the at least one voltage difference.

15. The method of claim 14, wherein the plurality of distributed voltage controllers comprises a plurality of operational amplifiers.

16. The method of claim 14, wherein:

sensing comprises sensing a first local voltage difference and a second local voltage difference in the working ground plane area at different locations, generating comprises generating a first local voltage compensation signal based on the first local voltage difference and generating a second local voltage compensation signal based on the second local voltage difference, and driving comprises driving the working ground reference with the first local voltage compensation signal and driving the working ground reference with the second local voltage compensation signal at different working ground plane locations.

17. The method of claim 14, wherein the working ground reference is a solid state X-ray detector working ground reference.

* * * * *